US012588254B2

(12) United States Patent
Hitchcock et al.

(10) Patent No.: US 12,588,254 B2
(45) Date of Patent: Mar. 24, 2026

(54) SYSTEMS AND METHODS FOR PILLAR EXTENSION IN TERMINATION AREAS OF WIDE BAND GAP SUPER-JUNCTION POWER DEVICES

(71) Applicant: GENERAL ELECTRIC COMPANY, Schenectady, NY (US)

(72) Inventors: Collin William Hitchcock, Clifton Park, NY (US); Reza Ghandi, Niskayuna, NY (US)

(73) Assignee: GE Infrastructure Technology LLC, Greenville, SC (US)

( * ) Notice: Subject to any disclaimer, the term of this patent is extended or adjusted under 35 U.S.C. 154(b) by 719 days.

(21) Appl. No.: 17/948,670

(22) Filed: Sep. 20, 2022

(65) Prior Publication Data

US 2024/0096936 A1 Mar. 21, 2024

(51) Int. Cl.

| | |
|---|---|
| *H01L 29/06* | (2006.01) |
| *H10D 12/01* | (2025.01) |
| *H10D 30/63* | (2025.01) |
| *H10D 62/10* | (2025.01) |
| *H10D 62/17* | (2025.01) |
| *H10D 62/832* | (2025.01) |

(52) U.S. Cl.
CPC ......... *H10D 62/111* (2025.01); *H10D 12/031* (2025.01); *H10D 30/63* (2025.01); *H10D 62/292* (2025.01); *H10D 62/8325* (2025.01)

(58) Field of Classification Search
CPC .... H10D 62/111; H10D 12/031; H10D 30/63; H10D 62/292; H10D 62/8325; H10D 30/665; H10D 62/157; H10D 62/127
See application file for complete search history.

(56) References Cited

U.S. PATENT DOCUMENTS

2018/0166531 A1\* 6/2018 Bolotnikov ....... H01L 21/26513
2023/0290817 A1\* 9/2023 Narita ................ H10D 62/8325

\* cited by examiner

*Primary Examiner* — Cuong B Nguyen
(74) *Attorney, Agent, or Firm* — Fletcher Yoder, P.C.

(57) ABSTRACT

A super-junction (SJ) device includes a first epitaxial (epi layer) that forms a first SJ layer of the SJ device and includes a second epi layer disposed on the first SJ layer that forms a device layer of the SJ device. An active area and a termination area of the first epi layer includes a first set of SJ pillars that have a particular doping concentration of a first conductivity type and a second set of SJ pillars that have the particular doping concentration of a second conductivity type. A termination area of the second epi layer includes one or more implanted regions that form a junction termination that overlaps with at least one SJ pillar of the first set of SJ pillars or the second set of SJ pillars in the termination area of the first epi layer.

13 Claims, 6 Drawing Sheets

SYSTEMS AND METHODS FOR PILLAR EXTENSION IN TERMINATION AREAS OF WIDE BAND GAP SUPER-JUNCTION POWER DEVICES

GOVERNMENT LICENSE RIGHTS

This invention was made with government support under DE-AR0001007 awarded by ARPA-E. The government has certain rights in the invention.

BACKGROUND

The subject matter disclosed herein relates to wide band gap power devices (e.g., silicon carbide (SiC) power devices) and, more specifically, to termination designs for wide band gap super-junction (SJ) power devices.

For a semiconductor power device, a termination, such as a junction termination, can be used to generally prevent electric field crowding near the edges of an active area of the device during reverse bias operation. As used herein, the term "junction termination" is meant to encompass termination structures that employ p/n junctions, either floating or electrically attached to the primary blocking junction, to shape and control the electric field surrounding the active area of a device. For instance, a junction termination allows a gradual reduction of the magnitude of the electric field over a termination area of the device surrounding the active area of the device. In this way, the junction termination prevents premature device breakdown that results from electric field crowding effects and allows reliable operation of the device. Accordingly, it may be desirable to develop improved termination designs that reduce the magnitude of the electric field over the termination area.

BRIEF DESCRIPTION

In an embodiment, a super-junction (SJ) device includes a first epitaxial (epi layer) that forms a first SJ layer of the SJ device and includes a second epi layer disposed on the first SJ layer that forms a device layer of the SJ device. An active area and a termination area of the first epi layer includes a first set of SJ pillars that have a particular doping concentration of a first conductivity type and a second set of SJ pillars that have the particular doping concentration of a second conductivity type. A termination area of the second epi layer includes one or more implanted regions that form a junction termination that overlaps with at least one SJ pillar of the first set of SJ pillars or the second set of SJ pillars in the termination area of the first epi layer.

In another embodiment, a method of manufacturing a super-junction (SJ) device includes forming a first SJ layer by forming a first epitaxial (epi) layer on an underlying layer, implanting an active area of the first epi layer and a termination area of the first epi layer with a first set of SJ pillars that comprise a particular doping concentration of a first conductivity type, and implanting the active area of the first epi layer and the termination area of the first epi layer with a second set of SJ pillars that comprise the particular doping concentration of a second conductivity type. The method also includes forming a device layer of the SJ device by forming a second epi layer on the first SJ layer, implanting an active area of the second epi layer with a first set of device layer pillars that include a particular doping concentration of the first conductivity type, implanting the active area of the second epi layer with a second set of device layer pillars to yield the particular doping concentration of the second conductivity type, and forming a junction termination in the device layer by implanting a termination area of the second epi layer with one or more regions having the second conductivity type. The junction termination overlaps with at least one SJ pillar of the first set of SJ pillars or the second set of SJ pillars in the termination area of the first epi layer.

In another embodiment, a silicon carbide (SiC) super-junction (SJ) device includes a first super-junction (SJ) layer formed in a first epitaxial (epi) layer of the SiC-SJ device and includes a device layer formed in a second epi layer of the SiC-SJ device that is disposed on the first SJ layer. A termination area of the first SJ layer includes a first set of SJ pillars that include a particular doping concentration of a first conductivity type and a second set of SJ pillars that include a particular doping concentration of a second conductivity type. A termination area of the device layer includes one or more implanted regions that form a junction termination of the SiC-SJ device that overlaps with at least one SJ pillar of the first set of SJ pillars or the second set of SJ pillars in the termination are of the first SJ layer.

BRIEF DESCRIPTION OF THE DRAWINGS

These and other features, aspects, and advantages of the present invention will become better understood when the following detailed description is read with reference to the accompanying drawings in which like characters represent like parts throughout the drawings, wherein.

DETAILED DESCRIPTION

Figure 1:
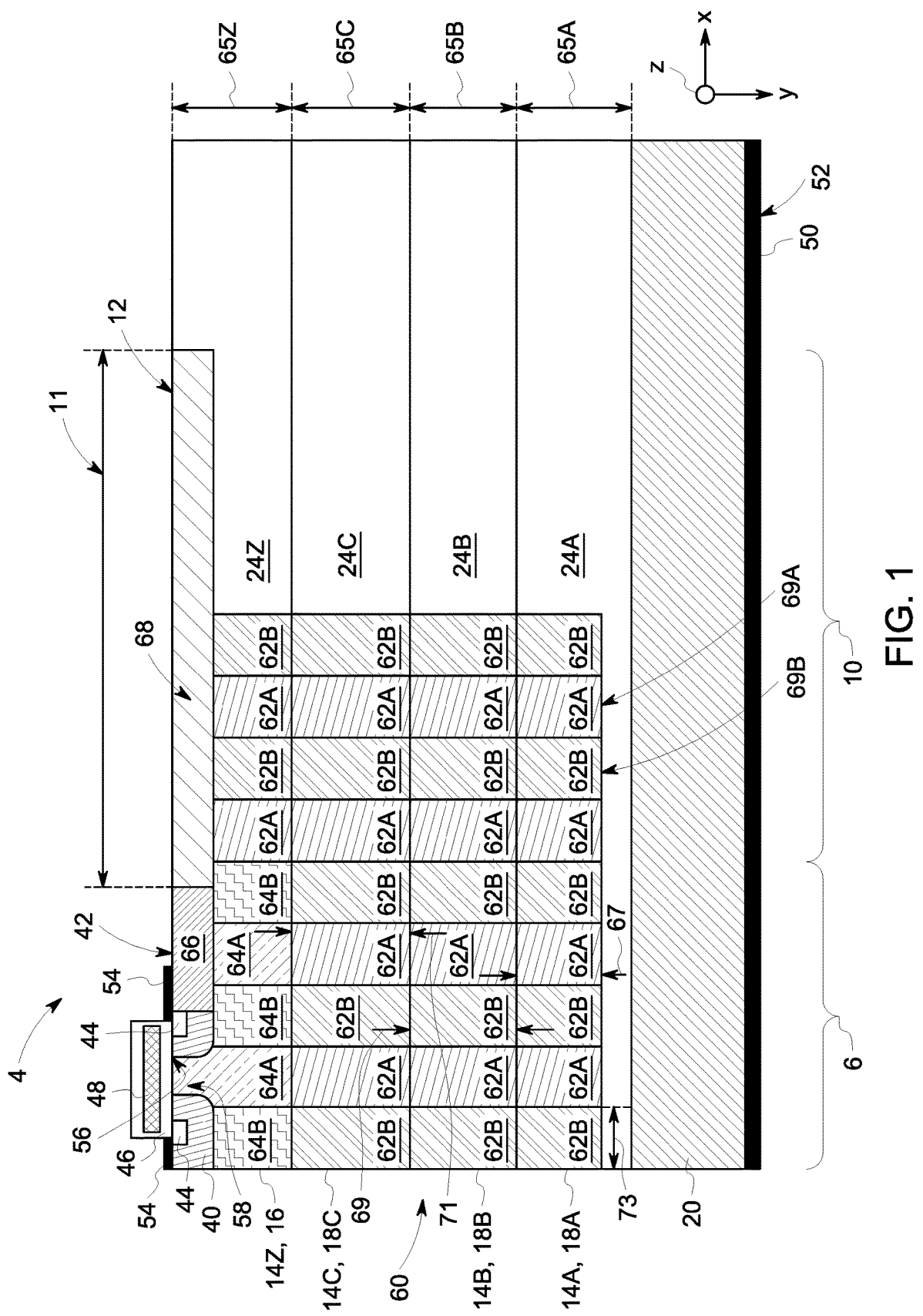
FIG. 1 is a schematic diagram illustrating a cross-sectional view of a portion of an embodiment of a multi-layer silicon carbide super-junction (SiC-SJ) device having a termination area that includes a junction termination extension (JTE) structure and a set of super junction (SJ) pillars, in accordance with aspects of the present technique.

One or more specific embodiments will be described below. In an effort to provide a concise description of these embodiments, not all features of an actual implementation are described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

Unless defined otherwise, technical and scientific terms used herein have the same meaning as is commonly understood by one of ordinary skill in the art to which this disclosure belongs. The terms "first", "second", and the like, as used herein do not denote any order, quantity, or importance, but rather are used to distinguish one element from another. Also, when introducing elements of various embodiments of the present disclosure, the articles "a," "an," and "the" are intended to mean that there are one or more of the elements. The terms "comprising," "including," and "having" are intended to be inclusive and mean that there may be additional elements other than the listed elements. Additionally, it should be understood that references to "one embodiment" or "an embodiment" of the present disclosure are not intended to be interpreted as excluding the existence of additional embodiments that also incorporate the recited features. If ranges are disclosed, the endpoints of all ranges directed to the same component or property are inclusive and independently combinable. The modifier "about" used in connection with a quantity is inclusive of the stated value and has the meaning dictated by the context (e.g., includes the degree of process variations or errors associated with measurement of the particular quantity). The modifier "substantially," when used in combination with a descriptive term, is intended to convey that the descriptive terms mostly, mainly, or predominately apply (e.g., applies to greater than 90%, greater than 95%, or greater than 99% of the time), and may be used to account for limited exceptions that may result from process variations and technical limitations understood by those of the art.

As used herein, the term "layer" refers to a material disposed on at least a portion of an underlying surface in a continuous or discontinuous manner. Further, the term "layer" does not necessarily mean a uniform thickness of the disposed material, and the disposed material may have a uniform or a variable thickness. Furthermore, the term "a layer" as used herein refers to a single layer or a plurality of layers, unless the context clearly dictates otherwise. The term "adjacent" as used herein means that the two layers or features are disposed contiguously and in direct contact with each other. In the present disclosure, when a layer/device is being described as "on" another layer or substrate, it is to be understood that the layers/devices can either be directly contacting each other or have one (or more) layer or feature between the layers and devices. Further, the term "on" describes the relative position of the layers/devices to each other and does not necessarily mean "on top of" since the relative position above or below depends upon the orientation of the device to the viewer. Moreover, the use of "top," "bottom," "above," "below," "upper", "buried" and variations of these terms is made for convenience and does not require any particular orientation of the components unless otherwise stated. With this in mind, as used herein, the terms "lower," "buried," "middle," or "bottom" refer to a feature (e.g., epitaxial layer, termination area) that is relatively nearer the substrate layer, while the terms "top" or "upper" refer to the particular feature (e.g., epitaxial layer, termination area) that is relatively the farthest from the substrate layer.

Present embodiments are directed toward designs and methods for manufacturing wide band gap super-junction (SJ) power devices, such as silicon carbide super-junction (SiC-SJ) power devices. The disclosed designs and methods are useful in the manufacture of SJ devices, such as metal-oxide-semiconductor field-effect transistors (MOSFETs), junction field effect transistors (JFETs), bipolar junction transistors (BJTs), diodes, as well as other SJ devices that may be useful for medium-voltage (e.g., 2 kilovolts (kV)–10 kV) and high-voltage (e.g., greater than or equal to 10 kV) power conversion related applications. As discussed below, the disclosed SJ device designs include multi-layered termination areas implemented using repeated epitaxial growth and dopant implantation steps. As used herein, the term "multi-layered," as well as references to a particular number of layers, for example, "two-layered," "three-layered," "four-layered," refer to the number of epitaxial layers, also referred to herein as epi layers.

More specifically, present embodiments are directed toward designs and methods for manufacturing power device terminations, such as junction terminations, for wide band gap SJ devices (e.g., SiC-SJ devices). As mentioned above, junction terminations are termination structures that employ p/n junctions to shape and control the electric field surrounding the device active area. For instance, a junction termination allows a gradual reduction of the magnitude of the electric field over a termination area of the device surrounding the active area of the device. In this way, the junction termination prevents premature device breakdown that results from electric field crowding effects and allows reliable operation of the device. Accordingly, the disclosed SJ termination designs include one or more regions of n-type and/or p-type doping arranged in specific ways to form a junction termination, such as a junction termination extension (JTE), to allow gradual reduction of the magnitude of the electric field outside of the active area (e.g., a conductive region) of a SJ power device under reverse bias conditions.

As discussed in detail below, present embodiments are directed towards JTE designs that include these regions of n-type and/or p-type doping to achieve a high blocking voltage, to prevent premature device breakdown that results from electric field crowding effects, and to allow reliable operation of these devices, especially when subjected to long-term high-temperature and/or high-voltage operation. In various embodiments, these regions of doping may be implemented as masked regions, disconnected blocks, continuous pillars, stripes, segments, grids, dots, blobs, or any other suitable shape. In certain embodiments, these regions of doping may be described as "floating," meaning that they are not in electrical contact with a device terminal or under an external applied bias; however, in other embodiments, at least a portion of these regions may be in electrical contact with a device terminal. The positions and dimensions of these implanted regions in the termination area of the disclosed SJ devices are designed to achieve a high blocking voltage, to prevent premature device breakdown that results from electric field crowding effects, and to allow reliable operation of these devices particular when subject to long-term, high-temperature/high-voltage operation.

In certain embodiments, the JTE may extend a distance from an active area of the top epi layer of the device through a termination area of the top epi layer of the device (e.g., within the x-z plane of the illustrated embodiments). For example, the distance over which the JTE extends from the active area through the termination area may be between five percent to one hundred percent, inclusive, of a length of the termination area of the top epi layer. Additionally, after each epi layer is formed, portions of the active area and the termination area of the device may be implanted with dopant of a first conductivity type (e.g., n-type) and the second conductivity type (e.g., p-type) using high-energy (HE) implantation operations to form SJ pillars of the SJ layers. A top or device epi layer may also be implanted one or more times to form device structures (e.g., well regions, source regions, etc.), and these implantation operations may be performed using a standard energy implantation process in certain embodiments. For example, after forming the SJ pillars using HE implantation operations in an epi layer, a portion of the SJ pillars of the active region and the termination region of the epi layer has a particular doping concentration of the first conductivity type, while the remaining SJ pillars may have the particular doping concentration of the second dopant type.

Further, one or more SJ pillars implanted in the termination area of the epi layers may overlap with the JTE. That is, one or more SJ pillars may be implanted in the termination area of one or more epi layers below the JTE in the termination area of the top epi layer. Additionally, the SJ pillars that overlap with the JTE may surround the active area of the device. For instance, the SJ pillars that overlap with the JTE structure may be deposited in annular rows or substantially parallel rows around the active area of the device. As used herein, the term "annular" refers to a ringed shape, a circular shape, an elliptical shape, a rounded rectangular shape, a rounded square shape, or the like. In this way, the JTE and the SJ pillars that overlap with the JTE distribute and gradually reduce the electric field over the termination area, thereby preventing premature device breakdown that would otherwise result from electric field crowding effects.

With the foregoing in mind, FIG. 1 illustrates a cross-sectional view of an embodiment of a SiC-SJ device 4 having an active area 6 as well as a termination area 10 having a junction termination, such as a junction termination extension (JTE) 12, in accordance with embodiments of the present approach. It may be appreciated that, in order to more clearly illustrate certain components of the SiC-SJ device 4, certain commonly understood design elements (e.g., top metallization, passivation, and so forth) may be omitted. It may also be appreciated that, while the device 4 is described herein in the context of a SiC-SJ device, in other embodiments, other wide band gap materials (e.g., germanium (Ge), aluminum nitride (AlN), gallium nitride (GaN), boron nitride, gallium arsenide (GaAs), diamond (C), etc.) may be used, in accordance with the present disclosure.

The illustrated embodiment of the SiC-SJ device 4 includes a number of epitaxial (epi) layers 14. These include epi layer 14Z that forms a device layer 16 of the SiC-SJ device 4, as well as epi layers 14A, 14B, and 14C that respectively form super-junction (SJ) layers 18A, 18B and 18C of the SiC-SJ device 4. While the illustrated embodiment includes four epi layers 14, in other embodiments, the SiC-SJ device 4 may include any suitable number of epi layers 14 (e.g., 2, 3, 4, 5, 6, or more) to yield a SiC-SJ device 4 having a particular desired voltage rating. The epi layers 14 may be fabricated using repeated cycles of epitaxial overgrowth. As illustrated, the first epi layer 14A is formed and disposed directly on a substrate layer 20, and the second epi layer 14B is formed and disposed directly on the first epi layer 14A. Further, the third epi layer 14C is formed and disposed directly on the second epi layer 14B, and the fourth epi layer 14Z (e.g., the device epi layer) is formed and disposed directly on the third epi layer 14C. In other embodiments, the SiC-SJ device 4 may include additional epi layers 14 (e.g., 14D, 14E, 14F, and so forth), including any suitable number of SJ layers 18, intervening between the first epi layer 14A and the device epi layer 14Z and/or disposed below the first epi layer 14A.

For the embodiment illustrated in FIG. 1, in the active area 6, a top surface 42 of the device layer 16 includes a well region 40 having a second conductivity type (e.g., a p-well region 40) disposed adjacent to a source region 44 having the first conductivity type (e.g., n-type source region 44). A dielectric layer 46 (also referred to as a gate insulating layer or gate dielectric layer) is disposed adjacent to the device layer 16, and a gate electrode 48 is disposed adjacent to the dielectric layer 46. Further, the SJ layer 18A is disposed on the substrate layer 20 (e.g., a semiconductor substrate layer, a wide band gap substrate layer), and a drain contact 50 is disposed on the bottom 52 of the SiC-SJ device 4, adjacent to the substrate layer 20. As additionally illustrated in the embodiment of FIG. 1, a source contact 54 is disposed adjacent to the top surface 42 of the device layer 16, and is disposed on a portion of both the source region 44 and the well region 40 of the device layer 14Z.

During on-state operation of the illustrated SiC-SJ device 4, an appropriate gate voltage (e.g., at or above a threshold voltage (VTH) of the SiC-SJ device 4) causes an inversion layer to form in a channel region 56, as well as a conductive path to be enhanced in a junction field-effect transistor (JFET) region 58 due to the accumulation of carriers, allowing current to flow from the drain contact 50 (e.g., drain electrode, drain terminal) to the source contact 54 (e.g., source electrode, source terminal) within portions of the active area 6. The channel region 56 may be generally defined as an upper portion of the well region 40 disposed below the gate electrode 48 and the dielectric layer 46.

To reduce on-state resistance (Rds(on)) and resultant on-state conduction losses, the SiC-SJ device 4 includes a SJ region 60, which may have any suitable number of SJ layers 18, formed in the active area 6 of the SiC-SJ device 4. As illustrated in FIG. 1, each of the SJ layers 18 includes a first set of implanted SJ pillars 62A oppositely doped relative to a second set of implanted SJ pillars 62B. In other words, the first set of SJ pillars 62A has a first conductivity type (e.g., n-type SJ pillars 62), while the second set of SJ pillars 62B has a second conductivity type (e.g., p-type SJ pillars 62). In some embodiments, the first set of SJ pillars 62A may be doped with nitrogen, phosphorous, or another suitable n-type dopants, while the second set of SJ pillars 62B are doped with boron, aluminum, or another suitable p-type dopant, or vice versa. Although FIG. 1 illustrates that the SiC-SJ device 4 includes the first set of implanted SJ pillars 62A and the second set of implanted SJ pillars 62B in SJ layers 18A, 18B, and 18C, it should be understood that, in certain embodiments, one or more of the SJ layers 18A, 18B, and 18C of the SiC-SJ device 4 may include more or less implanted SJ pillars. For instance, one or more of the SJ layers 18A, 18B, and 18C of the SiC-SJ device 4 may include no implanted SJ pillars, two sets of implanted SJ pillars, three sets of implanted SJ pillars, four sets of implanted SJ pillars, or the like.

In any case, the dopant concentration in the first set of SJ pillars 62A and in the second set of SJ pillars 62B of the SJ region 60 is approximately the same (e.g., ±3%, ±2%, ±1%). For example, in some embodiments, each of the first set of SJ pillars 62A and each of the second set of SJ pillars 62B may have a dopant concentration greater than $5 \times 10^{15}$ cm$^{-3}$ and/or less than $1 \times 10^{17}$ cm$^{-3}$. In some embodiments, the first set of SJ pillars 62A and the second set of SJ pillars 62B are each generally designed to substantially deplete and to generally provide similar amounts (e.g., substantially equal amounts) of effective charge (e.g., per cm$^2$, normalized to device active area 6) from ionized dopants under reverse bias. Accordingly, the illustrated super-junction structure allows the SiC-SJ device 4 to achieve high breakdown voltage and low on-state resistance, since the p-type semiconductor portions and the n-type semiconductor portions are both substantially (e.g., completely) depleted under nominal blocking conditions.

The first epi layer 14A, the second epi layer 14B, the third epi layer 14C, and the device epi layer 14Z have respective thicknesses 65A, 65B, 65C, and 65Z, which may be the same or different, in certain embodiments. For instance, in certain embodiments, the thicknesses 65 (e.g., 65A, 65B, 65C, and 65Z) of the epi layers 14 may be between 2 microns (μm) and 15 μm (e.g., 10 μm or 12 μm). Additionally, the SJ pillars 62 in the SJ region 60 of the illustrated SiC-SJ device 4 have a particular depth (e.g., extending along the Y-axis). It should be appreciated that, in some embodiments, the depth of the SJ pillars 62 may be the same between the first set of SJ pillars 62A and the second set of SJ pillars 62B. In some embodiments, for example, each of the SJ pillars 62 may extend through the entire thickness 65A of the epi layer 14A and may contact (e.g., electrically couple to) the substrate layer 20. Alternatively, each of the SJ pillars 62 may not extend through the entire thickness 65A of the first epi layer 14A, leaving a gap (e.g., a region of epi doping) between the SJ pillars 62 and the substrate layer 20. Moreover, in some embodiments, each of the first set of SJ pillars 62A may contact (e.g., electrically couple to) at least one of a first set of device layer pillars 64A having a like conductivity type (e.g., a n-type device layer pillars), and each of the second set of SJ pillars 62B may contact (e.g., electrically couple to) at least one of a second set of device layer pillars 64B having a like conductivity type (e.g., a p-type device layer pillars), as described in greater detail below. It may be appreciated that since the first set of device layer pillars 64A and the second set of device layer pillars 64B are not charge balanced due to the other structures in the device layer 16, these device layer pillars are technically not themselves SJ structures. However, as a matter of convenience, device layer pillars 64A and 64B may be described herein as being part of the SJ pillars 62A and 62B, respectively, for certain embodiments.

Further, the depth of the SJ pillars 62 may be different in different SJ layers 18 of the SJ region 60. For example, as illustrated in FIG. 1, each of the first set of SJ pillars 62A and the second set of SJ pillars 62B in the first SJ layer 18A has a depth 67, while each of the first set of SJ pillars 62A and the second set of SJ pillars 62B in the second SJ layer 18B has a depth 69. The first set of SJ pillars 62A and the second set of SJ pillars 62B in the second SJ layer 18B extend through the entire thickness 65B of the epi layer 14B. By extending through the thickness 65B of the epi layer 14B, continuous, vertical SJ pillars 62 may be formed from each of the SJ layers 18 in the SJ region 60. The continuous, vertical SJ pillars 62 may then provide low conduction losses and high blocking voltages. It should be appreciated that, for the illustrated embodiment, a total depth of the first set of SJ pillars 62A is equivalent to the sum of the respective depths (e.g., 67, 69, and 71) of the first set of SJ pillars 62A in the first SJ layer 18A, second SJ layer 18B, and third SJ layer 18C. Similarly, a total depth of the second set of SJ pillars 62B is equivalent to the sum of the respective depths (e.g., 67, 69, and 71) of the second set of SJ pillars 62B in the first SJ layer 18A, the second SJ layer 18B, and the third SJ layer 18C.

With respect to dimensions, each of the SJ pillars 62 may have a particular width 73. In certain embodiments, the dimensions (e.g., width 73) of the SJ pillars 62 may vary along the Y-axis. Moreover, the dimensions of the first set of SJ pillars 62A may vary with respect to the dimensions of the second set of SJ pillars 62B. Further, the SJ pillars 62 may have different cross-sectional shapes (e.g., defined by the set of masks used during implantation). However, the dimensions of the first set of SJ pillars 62A in the first SJ layer 18A generally match the dimensions of a corresponding first set of SJ pillars 62A in the other SJ layers 18 (e.g., SJ layer 18B). Similarly, the dimensions of the second set of SJ pillars 62B in the first SJ layer 18A may match the dimensions of a corresponding second set of SJ pillars 62B in the other SJ layers 18 (e.g., SJ layer 18B), such that the corresponding first sets of SJ pillars 62A and the corresponding second sets of SJ pillars 62B of each of the SJ layers 18 are in alignment with each other.

Further, it should be appreciated that the doping of the epi layers 14, the doping of the SJ pillars 62, the thicknesses 65 of the epi layers 14, the depth (e.g., 67, 69, 71) of the SJ pillars 62, and the width 73 of the SJ pillars 62 may be varied for different embodiments to enable desired electrical performance (e.g., desired breakdown voltage) of the SiC-SJ devices 4. For example, in some embodiments, certain device parameters (e.g., the thickness 65 and doping of the epi layers 14) may be selected to provide a breakdown voltage of the SiC-SJ device 4 that is between approximately 1 kV and 10 kV, 1 kV and 5 kV, or any other suitable range. Further, in some embodiments, the dopant concentration of the SJ pillars 62 may be between approximately $5 \times 10^{15}$ cm$^{-3}$ and approximately $1 \times 10^{17}$ cm$^{-3}$. Moreover, in some embodiments, the SiC-SJ device 4 may include fewer or additional SJ layers 18 (e.g., two SJ layers 18, three SJ layers 18, four SJ layers 18, and/or the like) to achieve a desired voltage rating, for example.

Fabricating continuous, vertical super-junction pillars that extend through the thickness 65 of one or more epi layers 14 may be challenging for certain semiconductor materials (e.g., wide band gap semiconductor materials) having low diffusion coefficients of dopants. For example, fabricating such SJ pillars 62 may be challenging for embodiments in which the epi layers 14 are fabricated from SiC, which has lower diffusion coefficients for dopants compared to silicon (Si). For example, in order to form SJ pillars 62 (and device layer pillars 64) that, at least in some cases, extend through the entire thickness 65 of one or more epi layers 14, as present in a full SJ device, numerous (e.g., 10+) thin epitaxial growth/shallow ion implantation steps may be performed. Moreover, a combination of low energy implantation (e.g., implant acceleration energies less than 0.5 mega-electron volts (MeV)) and high energy implantation (e.g., implant acceleration energies greater than 0.5 MeV) may be used to implant the SJ pillars 62. For example, implant acceleration energies greater than 0.1 MeV and/or less than 50 MeV may be used. For instance, in some embodiments, an implant acceleration energy between 0.1 MeV and 30 MeV may be employed. Accordingly, the projected range (e.g., the penetration depth) of most commonly used SiC dopants (e.g., boron, nitrogen, phosphorus, aluminum) is approximately between 2 microns (μm) and 15 μm, which is at least suitable for implantation of the SJ pillars 62 through epi layers 14 having a thickness between 2 μm and 15 μm. Further, in some embodiments, a suitable high energy masking material (e.g., silicon on insulator (SOI), polysilicon, thick silicon oxide, and high-Z metals) may be employed during the implantation of the SJ pillars 62 and device layer pillars 64, as described in greater detail below.

Additionally, for the embodiment illustrated in FIG. 1, the device layer 16 includes the first set of device layer pillars 64A and the second set of device layer pillars 64B implanted in the active area 6. The first set of device layer pillars 64A has the same conductivity as the first set of SJ pillars 62A, while the second set of device layer pillars 64B has the same conductivity as the second set of SJ pillars 62B. Accordingly, the first set of device layer pillars 64A are oppositely doped relative to a second set of device layer pillars 64B. In other words, the first set of device layer pillars 64A have the first conductivity type (e.g., n-type device layer pillars 64), while the second set of device layer pillars 64B have the second conductivity type (e.g., p-type device layer pillars 64). Moreover, as illustrated, the first set of device layer pillars 64A is in contact with, and electrically coupled to, the first set of SJ pillars 62A in the third epi layer 14C (e.g., the SJ layer 18C). Further, the second set of device layer pillars 64B is in contact with, and electrically coupled to, the second set of SJ pillars 62B in the third epi layer 14C (e.g., the SJ layer 18C), the well region 40 having the same conductivity type as the second set of device layer pillars 64B, and/or the well region 66 having the same conductivity type as the second set of device layer pillars 64B. Accordingly, in some embodiments, the first set of device layer pillars 64A and/or the second set of device layer pillars 64B may be implanted according to any suitable means, such as using high energy implantation, lower energy implantation, or a combination thereof, as described above with reference to the set of SJ pillars 62.

In some embodiments, the dopant concentration in the first set of device layer pillars 64A and in the second set of device layer pillars 64B of the device layer 16 is approximately the same (e.g., ±3%, ±2%, ±1%). For example, in some embodiments, the first set of SJ pillars 62A and the second set of SJ pillars 62B are each generally designed to substantially deplete and to generally provide similar amounts (e.g., substantially equal amounts) of effective charge (e.g., per cm$^2$, normalized to device active area 6) from ionized dopants under reverse bias. Further, in some embodiments, the dopant concentration in the first set of device layer pillars 64A and in the second set of device layer pillars 64B of the device layer 16 is approximately the same (e.g., ±3%, ±2%, ±1%) as the dopant concentration in the first set of SJ pillars 62A and the second set of SJ pillars 62B. In such embodiments, the first set of device layer pillars 64A and the second set of device layer pillars 64B may be included within the first set of SJ pillars 62A and the second set of SJ pillars 62B, respectively, and a SJ layer 18Z or a partial SJ layer may be formed within the device layer 16.

In other embodiments, the dopant concentration in the first set of device layer pillars 64A is different from the dopant concentration in the second set of device layer pillars 64B of the device layer 16. For example, the dopant concentration in the second set of device layer pillars 64B may be approximately the same (e.g., ±3%, ±2%, ±1%) as the dopant concentration in the second set of SJ pillars 62B, while the dopant concentration in at least one of the first set of device layer pillars 64A may be lower than the dopant concentration in the second set of device layer pillars 64B and/or the dopant concentration in the first set of SJ pillars 62A, as discussed below with respect to FIGS. 13-18. In such embodiments, while the specific on-state resistance of the SiC-SJ device 4 may be greater than SiC-SJ devices 4 having substantially equal dopant concentrations in the first set of device layer pillars 64A and the second set of device layer pillars 64B, premature avalanche breakdown at the intersection of the termination area 10 and the active area 6 may be reduced. Accordingly, as discussed below, the maximum breakdown voltage of the SiC-SJ device 4 may be increased compared to other device designs.

As mentioned, the termination area 10 of the SiC-SJ device 4 may have a particular doping concentration (e.g., an epi doping concentration) of the first conductivity type (e.g., n-type). Further, in certain embodiments, within the active area 6, the doping concentration of the first set of SJ pillars 62A and the second set of SJ pillars 62B is substantially greater (e.g., 2×, 3×, 5×, 10×, or more) than the doping concentration of the termination regions 10. For example, the doping concentration of the first conductivity type in the first set of SJ pillars 62A and the doping concentration of the second conductivity type in the second set of SJ pillars may be greater than or equal to $5×10^{15}$ per cubic centimeter (cm$^{-3}$) and/or less than $1×10^{17}$ cm$^{-3}$, such as $1.0×10^{16}$ cm$^{-3}$. Moreover, within a certain device area (e.g., the termination area 10, and/or the active area 6) the doping concentration of the first conductivity type in the portions of the epi layers (e.g., the termination area 10, the first set of SJ pillars 62A, and/or the second set of SJ pillars 62B, respectively) may be the same or different.

For the embodiment illustrated in FIG. 1, the termination area 10 includes a junction termination, namely a JTE 12, in the termination region 10 of the device layer 16. As mentioned above, junction terminations are termination structures that employ p/n junctions to shape and control the electric field surrounding the active area 6 of the SiC-SJ device 4. For instance, the JTE 12 allows a gradual reduction of the magnitude of the electric field over the termination region 10 of the device layer 16 surrounding the active area 6 of the SiC-SJ device 4. In this way, the JTE 12 blocks or prevents premature device breakdown that results from electric field crowding effects and allows reliable operation of the device.

Accordingly, in various embodiments, the JTE 12 may include various types of implanted regions 68 of a dopant having the second conductivity type (e.g., p-type). The implanted regions 68 are disposed along a length 11 of the termination area 10 that extends from the active area 6 along the termination area 10. In various embodiments, these implanted regions 68 may be implemented as masked regions, disconnected blocks, continuous pillars, stripes, segments, grids, dots, blobs, or any other suitable shape. In certain embodiments, these regions of doping may be described as "floating," meaning that they are not in electrical contact with a device terminal or under an external applied bias; however, in other embodiments, at least a portion of these regions may be in electrical contact with a device terminal. These implanted regions 68 of the JTE 12 are utilized to distribute and reshape the electric field in at least the termination area 10 of the SiC-SJ device 4.

Additionally, one or more SJ pillars 62A, 62B implanted in the termination area 10 of the epi layers 14 may overlap with the JTE 12 in top epi layer 14Z. That is, one or more SJ pillars 62A, 62B may be implanted in the termination area 10 of one or more epi layers 14 below the JTE 12 in the termination area 10 of the top epi layer 14Z. As illustrated in FIG. 1, each epi layer 14 includes a first set of implanted SJ pillars 62A and a second set of implanted SJ pillars 62B in the termination area 10. As described above, the first set of implanted SJ pillars 62A and the second set of implanted SJ pillars 62B are oppositely doped relative to each other. Additionally, although FIG. 1 illustrates that the termination area 10 of each epi layer 14 includes the first set of implanted SJ pillars 62A and the second set of implanted SJ pillars 62B, it should be understood that, in certain embodiments, the respective termination areas 10 of the one or more of the epi layers 14A, 14B, 14C, 14Z may include more or less implanted SJ pillars. For instance, one or more of the epi layers 14A, 14B, 14C, 14Z may include no implanted SJ pillars, two sets of implanted SJ pillars, three sets of implanted SJ pillars, four sets of implanted SJ pillars, or the like. That is, the JTE 12 in the top epi layer 14Z may overlap with zero implanted SJ pillars in one or more of the epi layers 14A, 14B, 14C, 14Z, one set of implanted SJ pillars in one or more of the epi layers 14A, 14B, 14C, 14Z, two sets of implanted SJ pillars in one or more of the epi layers 14A, 14B, 14C, 14Z, three sets of implanted SJ pillars, four sets of implanted SJ pillars in one or more of the epi layers 14A, 14B, 14C, 14Z, or the like.

Additionally, the SJ pillars 62A, 62B that overlap with the JTE 12 may surround the active area 6 of the SiC-SJ device 4. In certain embodiments, the SJ pillars 62A, 62B that overlap with the JTE 12 may be deposited in annular rows around the active area 6 of the SiC-SJ device 4. As used herein, the term "annular" refers to a ringed shape, a circular shape, an elliptical shape, a rounded rectangular shape, a rounded square shape, or the like. In other embodiments, the SJ pillars 62A, 62B may be deposited in substantially parallel rows around the active area 6 of the SiC-SJ device 4. As illustrated in FIG. 1, the SJ pillars 62A, 62B are disposed in respective rows 69A, 69B along the length 11 of the SiC-SJ device 4 from the active area 6 through the termination area 10 (i.e., along the x-axis). For example, FIG. 1 illustrates that the SJ pillars 62A, 62B are disposed in four rows along the length of the termination area 10 of the SiC-SJ device 4. However, it should be understood that the termination area 10 may include any suitable number of rows of SJ pillars 62A, 62B. For example, the termination area 10 may include a single row of SJ pillars 62A, a single row of SJ pillars 62B, two rows of SJ pillars 62A, 62B, three rows of SJ pillars 62A, 62B, four rows of SJ pillars 62A, 62B, five rows of SJ pillars 62A, 62B, or the like. In certain embodiments, the JTE 12 may extend through the top epi layer 14Z a distance beyond the rows 69A, 69B of the SJ pillars 62A, 62B implanted in termination area 10 of the epi layers 14A, 14B, 14C, 14Z such that the JTE 12 partially overlaps with the rows 69A, 69B of the SJ pillars 62A, 62B. In other embodiments, the rows 69A, 69B of the SJ pillars 62A, 62B may extend through the termination area 10 of the epi layers 14A, 14B, 14C, 14Z such that the JTE 12 completely overlaps with the rows 69A, 69B of the SJ pillars 62A, 62B.

Figure 2:
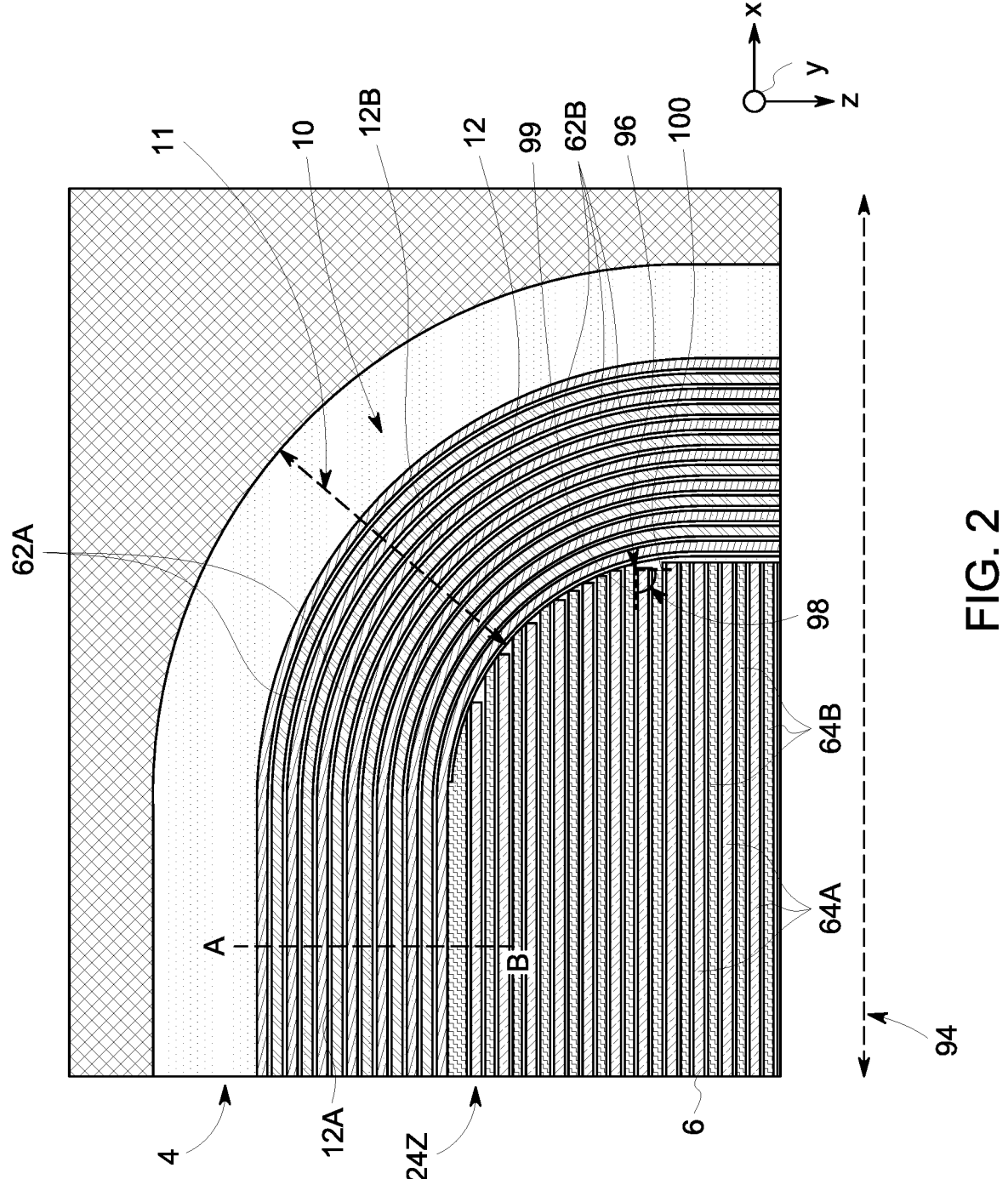
FIG. 2 is a top-down view of an embodiment of a device epitaxial layer of the SiC-SJ device of FIG. 1, including annular rows of a set of SJ pillars, in accordance with aspects of the present technique.

Additionally, as mentioned above, the SJ pillars 62A, 62B may be implanted in annular rows or substantially parallel rows in the top or device epi layer 24Z of the SiC-SJ device 4. For example, FIG. 2 illustrates a top-down view of an embodiment of a top or device epi layer 24Z of a SiC-SJ device 4 having an active area 6 and having a termination area 10 that includes a JTE 12. FIG. 2 does not illustrate various device structures (e.g., well regions, source regions, etc.) on top of the device epi layer 24Z for sake of convenience. However, in certain embodiments, it should be understood that such structures may be deposited on top of the device epi layer 24Z in the active area 6 of the SiC-SJ device 4, in accordance with the present disclosure. Further, FIG. 1 may illustrate a cross-sectional view of the device epi layer 24Z of the SiC-SJ device 4 of FIG. 2 along line A-B.

As illustrated in FIG. 2, the active area 6 includes a first set of implanted SJ pillars 64A and a second set of implanted SJ pillars 64B that are disposed in substantially parallel rows. As mentioned above, the first set of implanted SJ pillars 64A (e.g., n-type SJ pillars) are oppositely doped relative to the second set of implanted SJ pillars 64B (e.g., p-type SJ pillars). The substantially parallel rows of the first set of implanted SJ pillars 64A and the second set of implanted SJ pillars 64B extend along a length 94 of the SiC-SJ device 4 through the active area 6 of the SiC-SJ device 4 until the respective rows are proximate to and/or adjacent to the JTE 12 of the termination area 10 of the SiC-SJ device 4. For example, the substantially parallel rows of the first set of implanted SJ pillars 64A and the second set of implanted SJ pillars 64B have rectangular-shaped edges 96 proximate to and/or adjacent to the JTE 12 of the termination area 10. The edges 96 refer to the end portions (e.g., corners) of the substantially parallel rows nearest the termination area 10. As used herein, a "rectangular-shaped" edge 96 of a row of implanted SJ pillars (e.g., 64A, 64B) refers to the edge 96 of the row having a substantively right angle 98 with respect to a first side 99 of the row that extends along the x-axis and a second side 100 of the row that extends along the z-axis. For example, in certain embodiments, the angle 98 may be between eighty degrees and one hundred degrees with respect to the first side 99 and the second side 100, eighty-five degrees and ninety-five degrees with respect to the first side 99 and the second side 100, or substantially ninety degrees with respect to the first side 99 and the second side 100.

Additionally, for the embodiment illustrated in FIG. 2, the termination area 10 includes multiple annular rows of SJ pillars 62A, 62B surrounding the active area 6 of the SiC-SJ device 4. As mentioned above, the term "annular" refers to a ringed shape, a circular shape, an elliptical shape, a rounded rectangular shape, a rounded square shape, or the like. As illustrated in FIG. 2, for example, the annular rows of the SJ pillars 62A, 62B generally form a rounded rectangular shape around the active area 6 of the SiC-SJ device 4. In particular, the annular rows of the SJ pillars 62A, 62B are substantially parallel to the rows of the first set of implanted SJ pillars 64A and the second set of implanted SJ pillars 64B in a first region 12A of the termination area 10, the annular rows of the SJ pillars 62A, 62B are curved in a second region 12B of the termination area 10, and the annular rows of SJ pillars 62A, 62B are substantially perpendicular to the rows of the first set of implanted SJ pillars 64A and the second set of implanted SJ pillars 64B in a third region 12C of the termination area 10. In various embodiments, the curve of the annular rows of the SJ pillars 62A, 62B in the second region 12B has an angle less than ninety degrees. As illustrated in FIG. 2, the JTE 12 in the top epi layer 14Z may overlap with the rows 69A, 69B of the SJ pillars 62A, 62B in one or more of the epi layers 14A, 14B, 14C, 14Z. For instance, the rows 69A, 69B of the SJ pillars 62A, 62B may be implanted in one or more of the epi layers 14A, 14B, 14C, 14Z such that SJ pillars 62A, 62B overlap with at least five percent and up to one hundred percent of the JTE 12.

Figure 3:
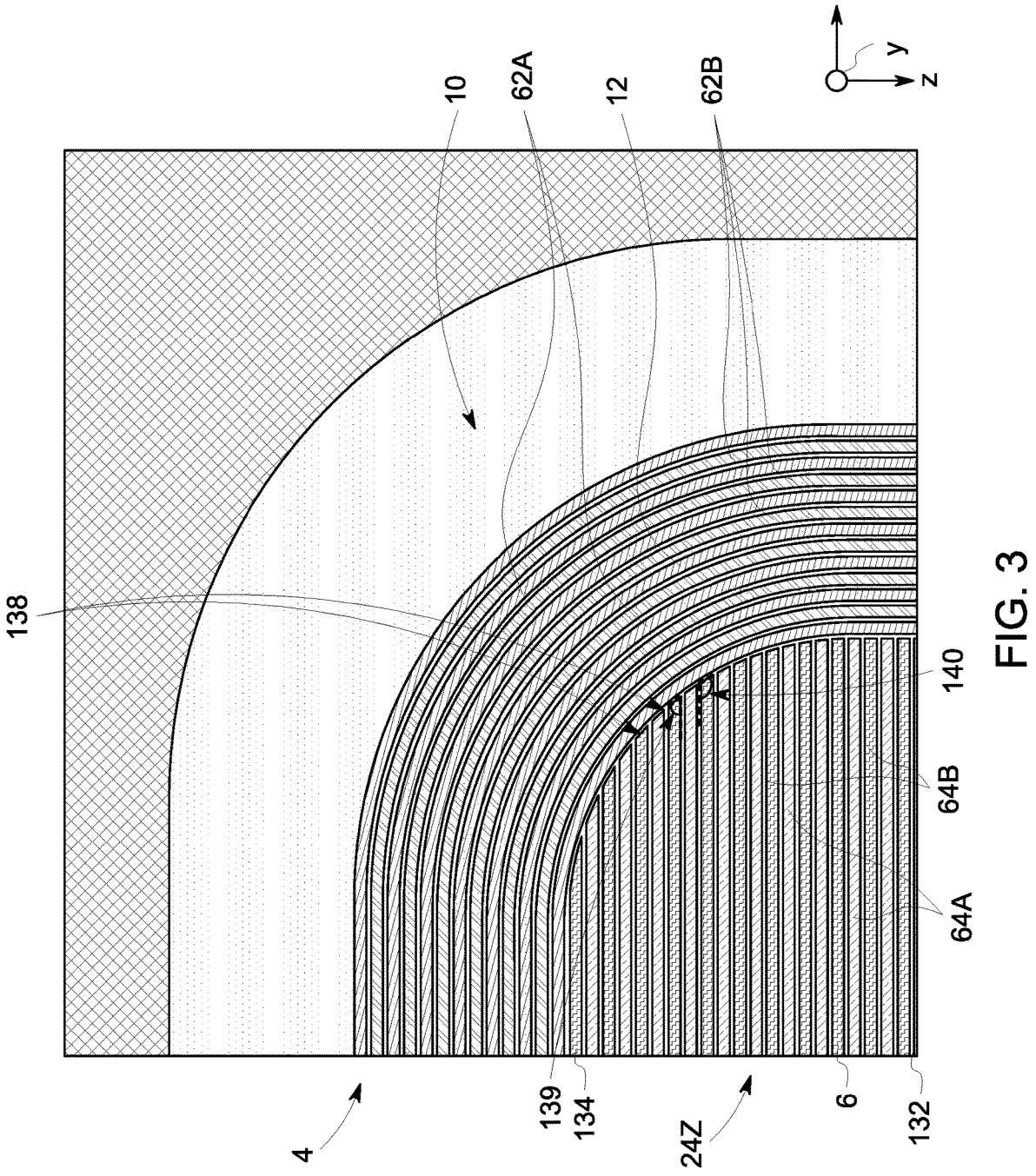
FIG. 3 is a top-down view of another embodiment of a device epitaxial layer of the SiC-SJ device of FIG. 1, including annular rows of a set of SJ pillars, in accordance with aspects of the present technique.

As mentioned above with respect to FIG. 2, the substantially parallel rows of the first set of implanted SJ pillars 64A and the second set of implanted SJ pillars 64B have rectangular-shaped edges 96 proximate to and/or adjacent to the JTE 12 of the termination area 10. In other embodiments, the substantially parallel rows of the first set of implanted SJ pillars 64A and the second set of implanted SJ pillars 64B may have angled or curved edges proximate to and/or adjacent to the JTE 12 of the termination area 10. FIG. 3 illustrates a top view of an embodiment of a top or device epi layer 24Z of a portion of a SiC-SJ device 4 having an active area 6 and having a termination area 10 that includes a JTE 12. FIG. 3 does not illustrate various device structures (e.g., well regions, source regions, etc.) on top of the device epi layer 24Z for sake of convenience. However, in certain embodiments, it should be understood that such structures may be deposited on top of the device epi layer 24Z in the active area 6 of the SiC-SJ device 4.

As illustrated in FIG. 3, the active area 6 includes a first set of implanted SJ pillars 64A and a second set of implanted SJ pillars 64B that are disposed in substantially parallel rows. Additionally, the JTE 12 overlaps with multiple annular rows 69A, 69B of SJ pillars 62A, 62B surrounding the active area 6 of the SiC-SJ device 4. As mentioned above, the substantially parallel rows of the first set of implanted SJ pillars 64A and the second set of implanted SJ pillars 64B have slanted edges 138 or curved edges 138 directly adjacent to the JTE 12 of the termination area 10. The slanted edges 138 or curved edges 138 refer to the end portions (e.g., corners) of the substantially parallel rows nearest the termination area 10. For instance, the respective edges 138 (i.e., end portions) of the substantially parallel rows of the first set of implanted SJ pillars 64A and the second set of implanted SJ pillars 64B are directly adjacent to the annular rows of the SJ pillars 62A, 62B of the termination area 10. As such, the respective edges 138 of the substantially parallel rows of the first set of implanted SJ pillars 64A and the second set of implanted SJ pillars 64B are slanted or curved in a manner that corresponds to the curve of the annular rows of the SJ pillars 62A, 62B in the termination area 10. That is, the respective edges 138 of the substantially parallel rows of the first set of implanted SJ pillars 64A and the second set of implanted SJ pillars 64B are not aligned with the x-axis or the z-axis.

As mentioned, in certain embodiments, the respective edges 138 of the substantially parallel rows of the first set of implanted SJ pillars 64A and the second set of implanted SJ pillars 64B are slanted in a manner that corresponds to the annular rows 69A, 69B of the SJ pillars 62A, 62B in the termination area 10. For instance, the respective edges 138 may have a first angle 139 that is less than ninety degrees between a first side of the edge 138 that extends along the x-axis and a second side of the edge 138 that is not aligned with the x-axis or the z-axis and a second angle 140 that is greater than ninety degrees between the second side of the edge 138 and the third side of the edge 138 that extends along the x-axis. In the illustrated embodiment of FIG. 3, the first angle 139 of each edge 138 of each row of the first set of implanted SJ pillars 64A and the second set of implanted SJ pillars 64B increases from the top row 134 to the bottom row 132 of the first set of implanted SJ pillars 64A and the second set of implanted SJ pillars 64B. Additionally, the second angle 140 of each edge 138 of each row of the first set of implanted SJ pillars 64A and the second set of implanted SJ pillars 64B decreases from the top row 134 to the bottom row 132 of the first set of implanted SJ pillars 64A and the second set of implanted SJ pillars 64B. In other embodiments, the respective edges 138 of the substantially parallel rows of the first set of implanted SJ pillars 64A and the second set of implanted SJ pillars 64B are curved with respect to the curve of the annular rows 69A, 69B of the SJ pillars 62A, 62B of the termination area 10. For instance, the respective edges of the substantially parallel rows of the first set of implanted SJ pillars 64A and the second set of implanted SJ pillars 64B may have a curved side that is directly adjacent to the annular rows of the SJ pillars 62A, 62B, such that the curve of the curved side corresponds to the curve of the annular rows 69A, 69B, of the SJ pillars 62A, 62B.

Figure 4:
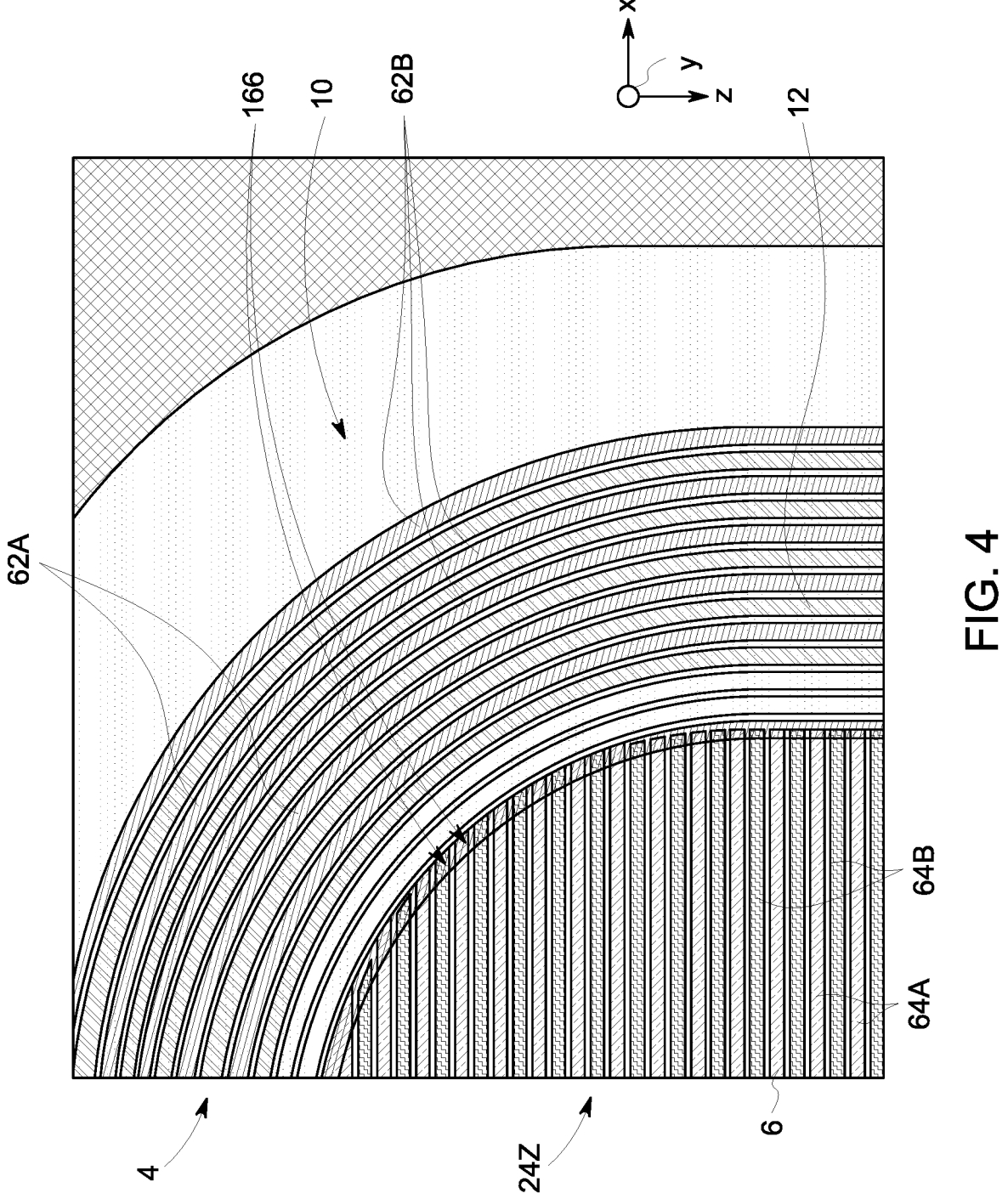
FIG. 4 is a top-down view of another embodiment of a device epitaxial layer of the SiC-SJ device of FIG. 1, including annular rows of a set of SJ pillars, in accordance with aspects of the present technique.

In other embodiments, the annular rows 69A, 69B of the SJ pillars 62A, 62B in the termination area 10 may overlap with respective edges (e.g., end portions proximate to the termination area 10) of the substantially parallel rows of the first set of implanted SJ pillars 64A and the second set of implanted SJ pillars 64B. In particular, FIG. 4 illustrates a top view of an embodiment of a top or device epi layer 24Z of a portion of a SiC-SJ device 4 having an active area 6 and a termination area 10 that includes a JTE 12. FIG. 4 does not illustrate various device structures (e.g., well regions, source regions, etc.) on top of the device epi layer 24Z for sake of convenience. However, in certain embodiments, it should be understood that such structures may be deposited on top of the device epi layer 24Z in the active area 6 of the SiC-SJ device 4.

As illustrated in FIG. 4, the active area 6 includes a first set of implanted SJ pillars 64A and a second set of implanted SJ pillars 64B that are disposed in substantially parallel rows. Additionally, the termination area 10 includes multiple annular rows 69A, 69B of SJ pillars 62A, 62B surrounding the active area 6 of the SiC-SJ device 4. As mentioned above, the annular rows 69A, 69B of the SJ pillars 62A, 62B in the termination area 10 overlap or partially overlap with respective edges 166 (e.g., end portions) of the substantially parallel rows of the first set of implanted SJ pillars 64A and the second set of implanted SJ pillars 64B. Similar to the embodiment illustrated in FIG. 3, the respective edges 166 of the substantially parallel rows of the first set of implanted SJ pillars 64A and the second set of implanted SJ pillars 64B have slanted edges 166 or curved edges 166 directly adjacent to the JTE 12 and/or the termination area 10.

Figure 5:
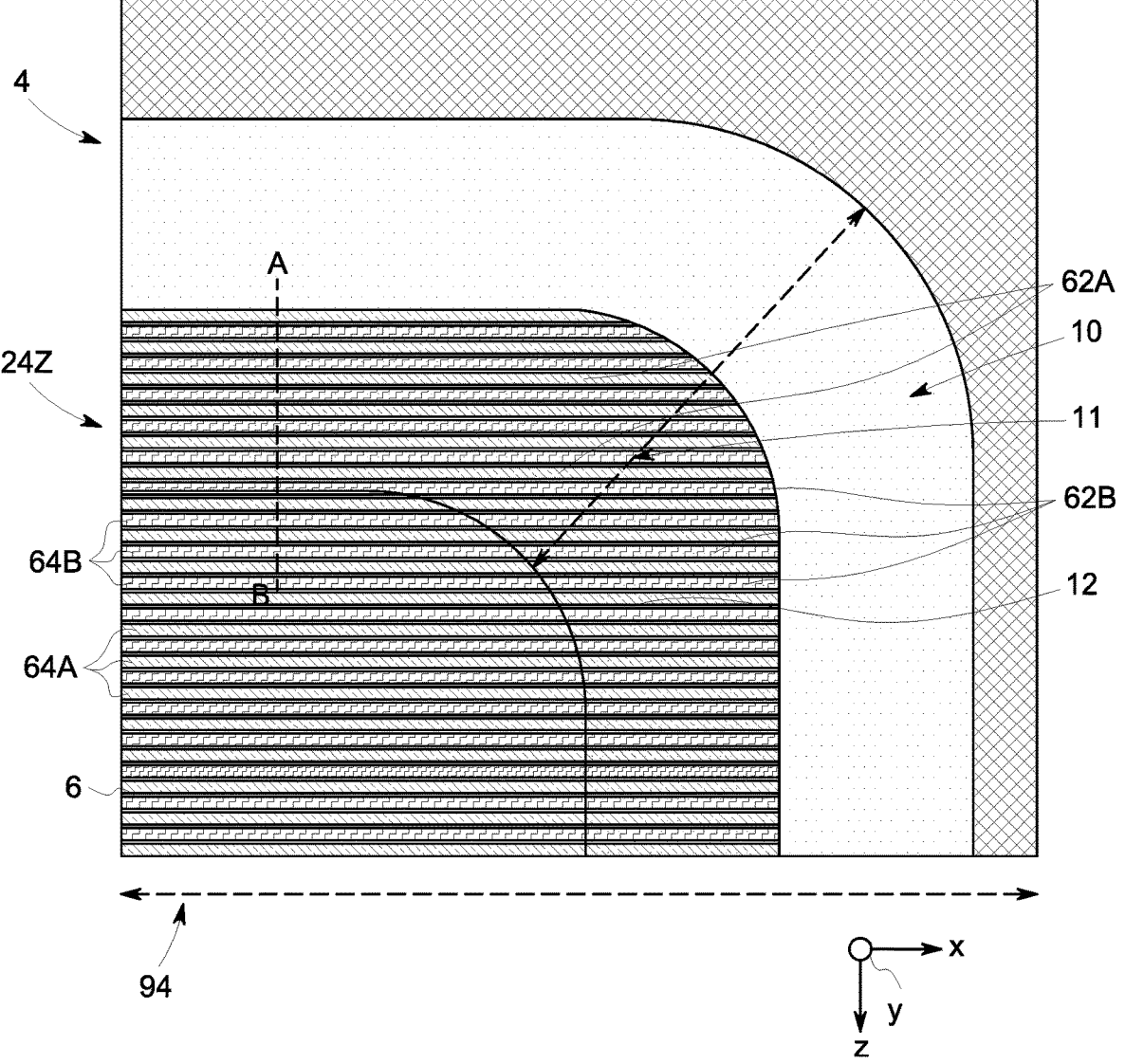
FIG. 5 is a top-down view of an embodiment of a device epitaxial layer of the SiC-SJ device of FIG. 1, including substantially parallel rows of a set of continuous JTE pillars, in accordance with aspects of the present technique.

As mentioned above with respect to FIG. 1, in certain embodiments, the SJ pillars 62A, 62B may be implanted in substantially parallel rows in the top or device epi layer 24Z of the SiC-SJ device 4. For example, FIG. 5 illustrates a top view of an embodiment of a top or device epi layer 24Z of a SiC-SJ device 4 having an active area 6 and having a termination area 10 that includes a JTE 12. FIG. 5 does not illustrate various device structures (e.g., well regions, source regions, etc.) on top of the device epi layer 24Z for sake of convenience. However, in certain embodiments, it should be understood that such structures may be deposited on top of the device epi layer 24Z in the active area 6 of the SiC-SJ device 4. Further, FIG. 1 may illustrate a cross-sectional view of the device epi layer 24Z of the SiC-SJ device 4 of FIG. 5 along line A-B.

As illustrated in FIG. 5, the active area 6 includes a first set of implanted SJ pillars 64A and a second set of implanted SJ pillars 64B that are disposed in substantially parallel rows. As mentioned above, the first set of implanted SJ pillars 64A (e.g., n-type SJ pillars) are oppositely doped relative to the second set of implanted SJ pillars 64B (e.g., p-type SJ pillars). The substantially parallel rows of the first set of implanted SJ pillars 64A and the second set of implanted SJ pillars 64B extend along a length 94 of the SiC-SJ device 4 in the x-axis through the active area 6 of the SiC-SJ device 4. For instance, the substantially parallel rows of the first set of implanted SJ pillars 64A and the second set of implanted SJ pillars 64B are substantially parallel to the x-axis. Additionally, termination area 10 includes substantially parallel rows 69A, 69B of SJ pillars 62A, 62B surrounding the active area 6 of the SiC-SJ device 4. As illustrated in FIG. 5, for example, the substantially parallel rows 69A, 69B of the SJ pillars 62A, 62B extend along the length 94 of the SiC-SJ device 4 through the termination area 10 and extend from the second set of implanted SJ pillars 64B in the active area 6 along the length 94 of the SiC-SJ device 4 through the termination area 10.

Figure 6:
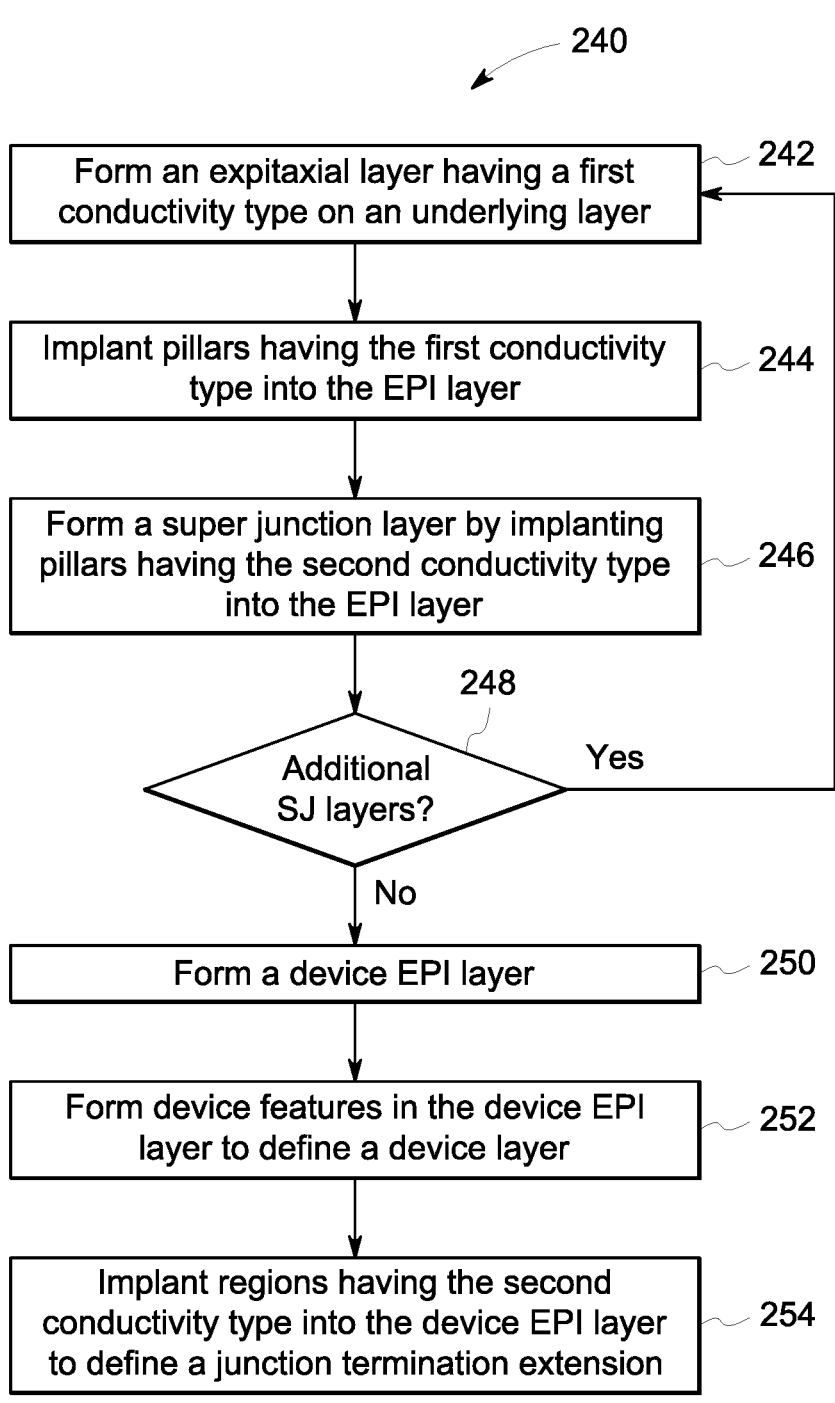
FIG. 6 is flow chart of a process for manufacturing an embodiment of a wide band gap SJ device having one or more junction terminations, in accordance with aspects of the present technique.

With the foregoing in mind, FIG. 6 is a flow chart of a process 240 for manufacturing an embodiment of the SiC-SJ device 4 having a JTE 12 that overlaps with one or more rows 69A, 69B of SJ pillars 62A, 62B, in accordance with embodiments described herein. Although the following description of the process 240 is described in a particular order, which represents a particular embodiment, it should be noted that the process 240 may be performed in any suitable order. Further, certain steps may be repeated or skipped altogether, and additional steps may be included in the process 240 in other embodiments.

The illustrated process begins with forming (process block 242) an epi layer having a particular epi doping concentration of a first conductivity type on an underlying layer, as illustrated in FIG. 1. In some embodiments, the underlying layer may include the semiconductor substrate layer 20. As described above, the substrate layer 20 may be made of silicon, silicon carbide (SiC), gallium nitride, diamond, aluminum nitride, boron nitride, or any other suitable wide band gap substrate. Alternatively, the epi layer may be formed on another epi layer 14 and/or a SJ layer 18, as described in greater detail below.

To form the first epi layer 14A on the underlying layer, the epi layer 14A may be grown using chemical vapor deposition (CVD). However, in some embodiments, the epi layer 14A may be grown onto the underlying layer using any suitable technique. The epi layer 14A may be formed from one or more wide band gap semiconductor materials, such as silicon carbide, gallium nitride, diamond, aluminum nitride, and/or boron nitride. Further, as discussed above, the epi layer 14A may have a first conductivity type (e.g., n-type) and a low dopant concentration relative to other regions of the SiC-SJ device 4 (e.g., the SJ pillars 62, the JTE 12, and/or the like).

Turning back to FIG. 6, after the first epi layer 14A is formed on the underlying layer, the illustrated process proceeds with implanting (process block 244) pillars of a first conductivity type into the first epi layer 14A. More specifically, to form the SJ layer 18A, the first set of SJ pillars 62A having the first conductivity type may be implanted into the active area 6 within the first epi layer 14A. Additionally, one or more SJ pillars 62A may be implanted in the termination area 10 within the first epi layer 14A. As mentioned above, the SJ pillars 62A may be implanted as one or more annular rows or one or more substantially parallel rows around the active area 6 of the first epi layer 14A. In certain embodiments, the implanted regions of the first conductivity type (e.g., n-type) may extend through the thickness 65A of the first epi layer 14A. Accordingly, in some embodiments, the regions of the first conductivity type may be implanted using a suitable high energy ion implantation technique. As such, each of the one or more regions may be implanted to a depth greater than 1 μm (e.g., to depths of 2 μm to 15 μm) within the epi layer 14A. Moreover, an implantation energy greater than 500 keV and/or less than 50 MeV may be used to implant each of the one or more regions. As such, a high energy implantation mask (e.g., silicon on insulator (SOI), polysilicon, thick silicon oxide, high-Z metals such as platinum, molybdenum, gold) may be used in conjunction with the high energy ion implantation. Moreover, the mask may be formed using any suitable means. That is, for example, the mask may be deposited, grown, and/or coated directly onto the portion of the epi layer 14A. Furthermore, once the mask material has been deposited on the surface of the epi layer

14A, the mask may be formed by patterning (e.g., lithographically patterning) the mask material to expose or uncover a portion of the epi layer 14A. The SJ pillars 62A may then be selectively implanted through the exposed portion of the epi layer 14A.

Additionally, to form the SJ layer 18A, the second set of SJ pillars 62B of the second conductivity type (e.g., p-type) is implanted (process block 246) into the active area 6. Additionally, one or more SJ pillars 62B may be implanted in the termination area 10 within the first epi layer 14A. As mentioned above, the SJ pillars 62B may be implanted as annular rows or substantially parallel rows around the active area 6 of the first epi layer 14A. In some embodiments, the SJ layer 18A may be formed using a method of self-alignment and a set of masks, as described in the U.S. Pat. No. 10,636,660, entitled, "SUPER-JUNCTION SEMICONDUCTOR DEVICE FABRICATION," filed Dec. 20, 2018, the disclosure of which is incorporated by reference herein in its entirety for all purposes. For example, after implanting the SJ pillars 62A into a first portion of the epi layer 14A using a first mask, as described above, which covers a second portion of the epi layer, a second mask may be formed that is self-aligned relative to the first mask on the first portion of the epi layer 14A. In some embodiments, the second mask may be formed to have different physical and/or chemical properties relative to the first mask. For instance, the second mask may be formed from a different material, may undergo different chemical and/or physical alterations, and/or may be formed with different optical properties and/or wavelength absorption properties relative to the first mask. Accordingly, the first mask may then be removed by a suitable process (e.g., dissolved, stripped, and/or degraded) that leaves the second mask intact. By removing the first mask, the second portion of the epi layer 14A is exposed, while the first portion of the epi layer 14A remains masked by the second mask. Thus, the SJ pillars 62B may be selectively implanted into the second portion of the epi layer 14A, and the second mask may then be removed. More specifically, in some embodiments, the second set of SJ pillars 62B may be implanted adjacent to and interleaved between the first set of SJ pillars 62A. For embodiments in which the first and second mask are self-aligned, misalignment (e.g., overlap and/or gaps) between the SJ pillars 62A and the SJ pillars 62B, which can disrupt the uniformity of the electrical field and reduce the maximum blocking voltage of the SiC-SJ device 4, may be reduced or avoided.

The SJ pillars 62 may be implanted using any suitable means (e.g., high energy implant, lower energy implant), as discussed below. For instance, in some embodiments, the SJ pillars 62 may be implanted with standard low energy implantation techniques. For example, the SJ pillars 62 may be implanted to a depth less than or equal to 1 μm. Accordingly, an implantation energy less than 500 keV may be used to implant each of the SJ pillars 62. However, in some embodiments, the SJ pillars 62 may be implanted using a suitable high energy ion implantation technique. Accordingly, an implantation energy greater than 500 keV and/or less than 50 MeV may be used to implant each of the SJ pillars 62. Moreover, the masks described above may be a high energy implantation mask (e.g., silicon on insulator (SOI), polysilicon, thick silicon oxide, high-Z metals) used in conjunction with the high energy ion implantation.

To form a suitable number of SJ layers 18 in the SiC-SJ device 4, a portion of the process 240 (e.g., process block 242, process block 244, and/or process block 246) may be repeated one or more times. Accordingly, after the SJ layer 18A is formed, the process 240 may proceed with determining (decision block 248) whether an additional SJ layer 18B will be added to the SiC-SJ device 4. In embodiments having one or more additional SJ layers 18, for example, a second epi layer 14B may be formed (process block 242) on the previously implanted SJ layer 18A and a second SJ layer 18B may be formed (e.g., process block 244, process block 246). For example, for the embodiment of the SiC-SJ device intermediate 280 illustrated in FIG. 1, the portion of the process 240 (e.g., process block 242, process block 244, and/or process block 246) may also be repeated to form a third SJ layer 18C.

After completing fabrication of the one or more SJ layers 18, the process 240 illustrated in FIG. 10 proceeds with forming (process block 250) a device epi layer 14Z having the particular epi doping concentration of the first conductivity type. As discussed with reference to the formation of the one or more epi layers 14 of the SJ layers 18 (process block 242), the device epi layer 14Z may be grown using CVD. Alternatively, the device epi layer 14Z may be formed on the one or more underlying SJ layers 18 using any suitable technique. The device epi layer 14Z may also be formed from one or more wide band gap semiconductor materials, such as silicon carbide, gallium nitride, diamond, aluminum nitride, and/or boron nitride.

The process 240 illustrated in FIG. 10 then proceeds with forming (process block 254) certain device features within the active area 6 within the device epi layer 14Z to define a device layer 16. That is, for example, the first set of device layer pillars 64A and second set of device layer pillars 64B may be implanted in the active area 6 within the device epi layer 14Z. More specifically, in some embodiments, each of the first set of device layer pillars 64A and the second set of device layer pillars 64B may be implanted using high energy ion implantation techniques such that the first set of device layer pillars 64A contacts and electrically couples to the first set of SJ pillars 62A, and such that the second set of device layer pillars 64B contacts and electrically couples to the second set of SJ pillars 62B, as illustrated in FIG. 1. Further, in some embodiments, the first set of device layer pillars 64A and the second set of device layer pillars 64B may be implanted using the method of self-alignment and the set of masks, as described above with reference to the set of SJ pillars 62. Moreover, as described below, the doping concentration of at least one of the first set of device layer pillars 64A may be less than the doping concentration of the second set of device layer pillars 64B. Further, the well region 40, the source region 44, the intermediate well region 66 and/or the like may be formed (e.g., implanted) in the active area 6 and/or the intermediate area 8 within the device epi layer 14Z to define the device layer 16, as illustrated in FIG. 1. Accordingly, while the process block 252 is described herein as a single step, it may be appreciated that forming the device features (e.g., the first set of device layer pillars 64A, the second set of device layer pillars 64B, the well region 40, the intermediate well region 66, the source region 44, and/or the like) may constitute multiple steps, such as a separate implantation step for each respective feature and/or multiple implantation steps for each feature.

Further, the process 240 illustrated in FIG. 10 involves implanting (process block 254) various regions of doping having the second conductivity type into the termination region 10 of the device epi layer 14Z to define a junction termination, such as a JTE 12, in the device layer 16, as illustrated in FIG. 1. In various embodiments, these regions of doping may be implemented as masked regions, disconnected blocks, continuous pillars, stripes, segments, grids, dots, blobs, or any other suitable shape. In certain embodiments, these regions of doping may be described as "floating," meaning that they are not in electrical contact with a device terminal or under an external applied bias; however, in other embodiments, at least a portion of these regions may be in electrical contact with a device terminal. The implanted regions of doping may be implanted according to any suitable means (e.g., high energy implant, lower energy implant). Accordingly, in some embodiments, the regions of doping may be selectively implanted through a portion of the termination region 10 exposed by a mask formed on the termination region 10, and the mask may then be removed. Further, in certain embodiments, the regions of doping may be implanted to a depth less than or equal to 1 μm. Accordingly, an implantation energy less than 500 keV may be used to implant each of the regions of doping. However, in some embodiments, the regions of doping may be implanted according to a suitable high energy ion implantation technique. Accordingly, for such embodiments, each of the regions of doping may be implanted to a depth greater than approximately 2 μm and/or less than approximately 15 μm within the device epi layer 14Z. Moreover, an implantation energy greater than 500 keV and/or less than 50 MeV may generally be used to implant each of the regions of doping. Subsequently, other processing steps may be performed to form other features (e.g., gate electrode 48, dielectric layer 46, source contact 54, drain contact 50, and/or the like) of the SiC-SJ device 4 to form a functional power conversion device, in accordance with the present disclosure.

In certain embodiments, different implantation operations may be used to implant the features of the second conductivity type in the device epi layer 14Z, such as the well regions 40, the implanted regions of doping in the JTE 12, and the SJ pillars 62B. Alternatively, in some embodiments, the regions of doping in the JTE 12 may be implanted concurrently with other features of the device epi layer 14Z (e.g., device layer pillars 64B, well regions 40, intermediate well region 66). For instance, the regions of doping of the JTE 12 may be implanted with the same dopant type (e.g., a p-type or n-type dopant) and/or utilizing the same materials (e.g., Al, B, N, P, etc.) during the same ion implantation step used to implant these features having the second conductivity type, which may reduce fabrication time and cost.

It may be appreciated that, for certain embodiments, the epi layers of the SJ devices may be formed with the lowest controllable doping level, for example, without any intentional epi doping (e.g., without intentionally introducing any dopants) or at minimal doping level that allows control of the type (n or p) within specified low concentration range. However, it is recognized since impurities, such as nitrogen, may be present in machinery and/or tools used during the epitaxial growth process, the epi layers may still include a low amount of epi doping (e.g., of the first conductivity type, n-type), which is referred to herein a "minimized epi doping concentration." Accordingly, while the epi layers may be formed with no intentional doping concentration, the actual epi doping concentration of epi layers may be generally $8.0 \times 10^{13}$ cm$^{-3}$ or more, depending on the equipment used for epitaxial growth. For example, in certain embodiments discussed below, the minimized epi doping concentration of the first conductivity type (e.g., n-type) may be less than $3.0 \times 10^{15}$ cm$^{-3}$, less than $2 \times 10^{15}$ cm$^{-3}$, less than $1 \times 10^{15}$ cm$^{-3}$, or between $8 \times 10^{13}$ cm$^{-3}$ and $2 \times 10^{15}$ cm$^{-3}$. For example, when the first conductivity type is n-type, nitrogen, phosphorous, arsenic, antimony, and/or the like may be used as the dopant. Alternatively, when the first conductivity type is p-type, boron, aluminum, and/or the like may be used as the dopant.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

The techniques presented and claimed herein are referenced and applied to material objects and concrete examples of a practical nature that demonstrably improve the present technical field and, as such, are not abstract, intangible or purely theoretical. Further, if any claims appended to the end of this specification contain one or more elements designated as "means for [perform]ing [a function] . . . " or "step for [perform]ing [a function] . . . ", it is intended that such elements are to be interpreted under 35 U.S.C. 112(f). However, for any claims containing elements designated in any other manner, it is intended that such elements are not to be interpreted under 35 U.S.C. 112(f).

The invention claimed is:

1. A super-junction (SJ) device, comprising:
an active area comprising:
a first portion of the active area in a first epitaxial (epi) layer that forms a first SJ layer of the SJ device; and
a second portion of the active area in a second epi layer disposed on the first SJ layer that forms a device layer of the SJ device, wherein the first and second epi layers extend in a first direction parallel to a plane, wherein the second portion of the active area is disposed over the first portion of the active area in a first overlapping area extending in the first direction,
wherein the first portion of the active area of the first epi layer includes a first set of SJ pillars comprising a particular doping concentration of a first conductivity type and a second set of SJ pillars comprising the particular doping concentration of a second conductivity type; and
a termination area around the active area, comprising:
a first portion of the termination area of the first epi layer, wherein the first portion of the termination area ends at a first distance in the first direction away from the second portion of the active area, wherein the first portion of the termination area includes at least one SJ pillar comprising the particular doping concentration of the first conductivity type or the second conductivity type, wherein no SJ pillar in the first epi layer of the SJ device is located outside of the first portion of the termination area in the first direction; and
a second portion of the termination area of the second epi layer comprises one or more implanted regions that form a junction termination of the SJ device, wherein the junction termination ends at a second distance in the first direction away from the second portion of the active area, wherein the second distance is greater than the first distance in the first direction, wherein the junction termination is disposed over the first portion of the termination area in a second overlapping area in the first direction.

2. The SJ device of claim 1, wherein the at least one SJ pillar in the first portion of the termination area of the first epi layer is implanted as one or more respective annular rows surrounding the first portion of the active area of the first epi layer.

3. The SJ device of claim 2, wherein the first set of SJ pillars and the second set of SJ pillars in the first portion of the active area of the first epi layer comprise respective end portions that are adjacent to the one or more respective annular rows, and wherein the respective end portions are rectangular-shaped.

4. The SJ device of claim 2, wherein the first set of SJ pillars and the second set of SJ pillars in the first portion of the active area of the first epi layer comprise respective end portions that are adjacent to the one or more respective annular rows, and wherein the respective end portions are curved with respect to the one or more respective annular rows.

5. The SJ device of claim 2, wherein the first set of SJ pillars and the second set of SJ pillars in the first portion of the active area of the first epi layer comprise respective end portions that are adjacent to the one or more respective annular rows, and wherein the respective end portions are slanted and correspond to a curvature of the one or more respective annular rows.

6. The SJ device of claim 2, wherein the first set of SJ pillars and the second set of SJ pillars in the first portion of the active area of the first epi layer comprise respective end portions that are adjacent to the one or more respective annular rows, and wherein the one or more respective annular rows at least partially overlap the respective end portions of the first set of SJ pillars and the second set of SJ pillars in the active area of the first epi layer.

7. The SJ device of claim 1, wherein at least one SJ pillar in the first portion of the termination area of the first epi layer is implanted as one or more respective substantially parallel rows surrounding the active area of the first epi layer.

8. The SJ device of claim 7, wherein a first row of the one or more substantially parallel rows extends from the second set of SJ pillars in the first portion of the active area of the first epi layer into the first portion of the termination area of the first epi layer.

9. A silicon carbide (SiC) super-junction (SJ) device, comprising:
an active area comprising:
a first portion of the active area in a first super-junction (SJ) layer formed in a first epitaxial (epi) layer of the SiC-SJ device; and
a second portion of the active area in a device layer formed in a second epi layer of the SiC-SJ device, wherein the second epi layer is disposed on the first SJ layer, wherein the first and second epi layers extend in a first direction parallel to a plane, wherein the second portion of the active area is disposed over the first portion of the active area in a first overlapping area extending in the first direction; and
a termination area comprising:
a first portion of the termination area in the first SJ layer comprises a first set of SJ pillars comprising a particular doping concentration of a first conductivity type and a second set of SJ pillars comprising the particular doping concentration of a second conductivity type, wherein the first portion of the termination area ends at a first distance in the first direction away from the second portion of the active area, wherein no SJ pillar in the first epi layer of the SJ device is located outside of the first portion of the termination area in the first direction; and a second portion of the termination area in the device layer comprises one or more implanted regions that form a junction termination of the SiC-SJ device, wherein the junction termination ends at a second distance in the first direction away from the second portion of the active area, wherein the second distance is greater than the first distance in the first direction, wherein the junction termination is disposed over the first portion of the termination area in a second overlapping area in the first direction.

10. The SiC-SJ device of claim 9, wherein the first set of SJ pillars and the second set of SJ pillars in the first portion of the termination area of the first SJ layer are implanted as one or more respective annular rows surrounding the first portion of the active area of the first SJ layer.

11. The SiC-SJ device of claim 10, wherein respective spacings between the one or more respective annular rows are substantially constant with increasing distance from the first portion of the active area of the first SJ layer, and respective widths of the one or more respective annular rows are substantially constant with increasing distance from the first portion of the active area of the first SJ layer.

12. The SiC-SJ device of claim 9, wherein the first set of SJ pillars and the second set of SJ pillars in the first portion of the termination area of the first SJ layer are implanted as one or more respective substantially parallel rows in the first portion of the termination area of the first SJ layer surrounding the first portion of the active area of the first SJ layer.

13. The SiC-SJ device of claim 12, wherein a first row of the one or more substantially parallel rows extends from the first portion of the active area of the first SJ layer into the first portion of the termination area of the first SJ layer.

* * * * *